United States Patent [19]

Karasawa

[11] Patent Number: 4,544,166
[45] Date of Patent: Oct. 1, 1985

[54] BREATHER FOR ELECTRICAL APPARATUS
[75] Inventor: Kazuo Karasawa, Sagamihara, Japan
[73] Assignee: Nissan Motor Co., Ltd., Yokohama, Japan
[21] Appl. No.: 601,600
[22] Filed: Apr. 18, 1984
[30] Foreign Application Priority Data
  Apr. 28, 1983 [JP] Japan .................................. 58-65809
[51] Int. Cl.$^4$ .............................................. F16J 15/44
[52] U.S. Cl. .......................................... 277/57; 310/58
[58] Field of Search .................... 361/383; 310/88, 58, 310/55, 62; 277/53, 56, 57

[56] References Cited

U.S. PATENT DOCUMENTS

| | | | |
|---|---|---|---|
| 3,521,094 | 7/1970 | Renz et al. ............................ | 310/58 |
| 4,154,447 | 5/1979 | Francis ................................... | 277/57 |
| 4,290,610 | 9/1981 | Lizogub ................................. | 277/56 |
| 4,464,593 | 8/1984 | Kofink ................................... | 277/56 |

Primary Examiner—Robert I. Smith
Attorney, Agent, or Firm—Schwartz, Jeffery, Schwaab, Mack, Blumenthal & Evans

[57] ABSTRACT

A breather configuration for an electric apparatus such as a wiper motor includes a zigzag shaped air flow labyrinth which is formed by a breather outlet and a breather cap. The breather outlet includes a shaft having an air passage hole at its center and a flange formed at the end of the shaft. The flange has notches for passing the air through at its periphery. The breather outlet shaft fits into an installation hole provided in the case. A breather cap is attached to the periphery of the flange of the breather outlet. There is further provided a wall which is extended from the case to surround the breather outlet and the breather cap and an end of which is spaced from a body panel to form a small gap. In the above construction, the air flows through the air flow labyrinth and the gap between the wall and the body panel whereas the water falling on the breather configuration may be discharged by the wall and the labyrinth.

5 Claims, 5 Drawing Figures

BREATHER FOR ELECTRICAL APPARATUS

BACKGROUND OF THE INVENTION

The present invention relates to a breather for electrical apparatus, and more particularly, to a breather configuration having an air flow labyrinth.

Referring to FIG. 1, there is shown a prior art breather configuration of an electric apparatus such as a wiper motor 1 includes a motor yoke case 1a, a gear case 1b, and a breather tube 2 through which the interior of the motor yoke case 1a and communicated to atomosphere. The breather tube 2 is fixed to a body panel 4 in an engine room 5 by a plurality of clips 3. In the above construction, respiration of the breather configuration is achieved through the breather tube 2. What is to say, air will flow inside the cases 1a, 1b only through breather tube 2 when wiper motor 1 is activated and heated by electrical loss (Joule Heat) and the cases 1a, 1b are wetted causing the air inside the case to cool and contract. Therefore, this prevents water entry from a chink at around the external peripheral of the cases 1a, 1b.

However, in the prior art construction, it is necessary to arrange the breather tube 2 so that the opening end of the breather tube 2 will not be wetted. Also, the breather tube 2 is fixed by the clips 3 so as to avoid bending of the tube 2 in the engine room 5 and further, to avoid other components in the engine room 5 crushing the tube 2. Consequently, installation of the breather tube 2 becomes a troublesome matter That requires long hours and high cost.

SUMMARY OF THE INVENTION

One object of the present invention is to provide a breather construction for an electrical apparatus which permits easy installation and is low in price.

Another object of the present invention is to provide a breather for electrical apparatus which operates with high reliability.

Still another object for the present invention is to provide a breather configuration of an electrical apparatus which is capable of operating without a breezer tube.

Briefly described, these and other objects of the present invention are accomplished by the provision of a breather configuration for an electric apparatus in a case which comprises an installation hole for communicating the interior of the case to atmosphere, a breather outlet installed in the installation hole, and a breather cap associated with the breather outlet to provide an air flow labyrinth. The breather outlet includes a shaft having an air passage hole at the center thereof and a flange having a plurality of air passage notches at a periphery thereof. The breather cap is attached to the periphery of the flange. The configuration further comprises a wall which extends from the case so as to surround the air flow labyrinth.

BRIEF DESCRIPTION OF THE DRAWINGS

These and other objects, features and advantages of the present invention will be more apparent from the following description of the preferred embodiments, taken in conjunction with the accompanying drawings, in which.

DESCRIPTION OF THE PREFERRED EMBODIMENTS

Figure 1:
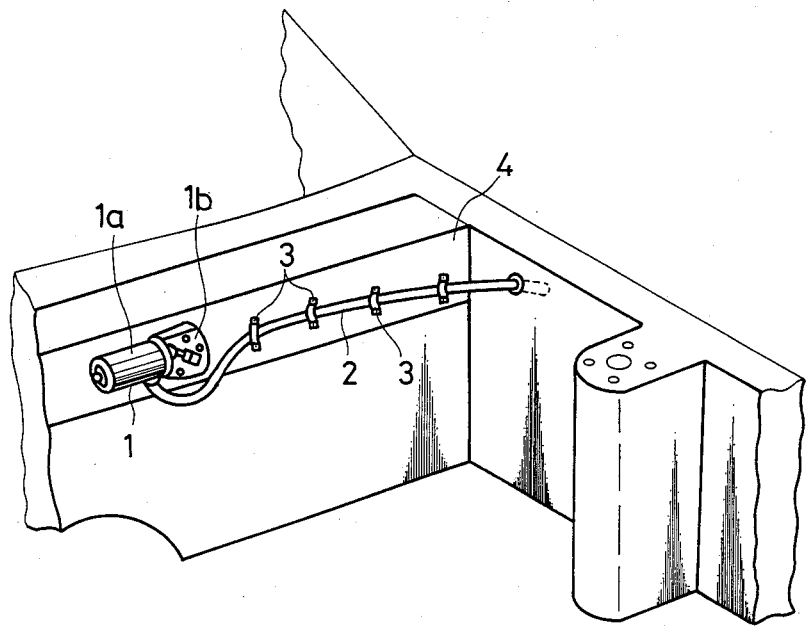
FIG. 1 is a perspective view showing a conventional breather configuration for a wiper motor in an engine room.
Figure 2:
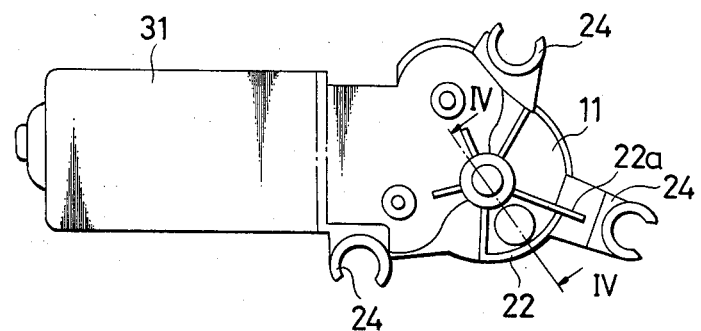
FIG. 2 is a front view of a breather configuration for a wiper motor embodying the present invention.
Figure 3:
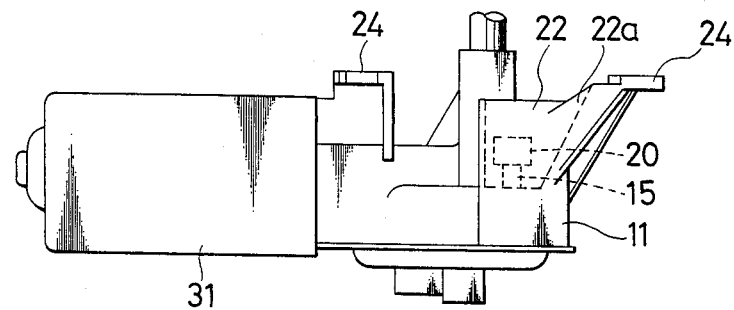
FIG. 3 is a plan view of the wiper motor illustrated in FIG. 2.
Figure 4:
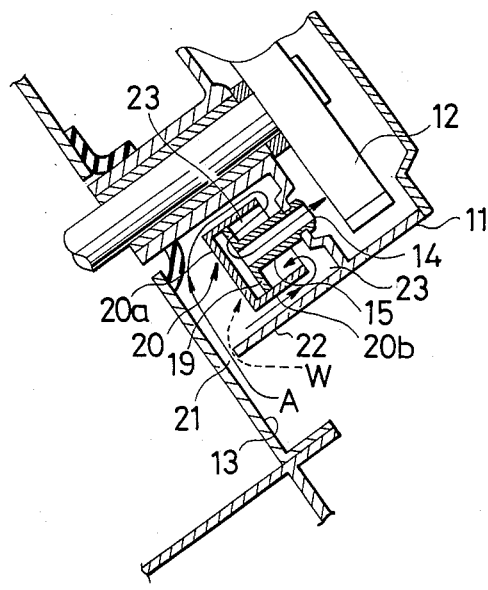
FIG. 4 is a cross-sectional view taken along the line IV—IV of FIG. 2.
Figure 5:
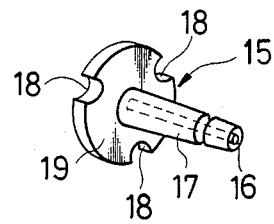
FIG. 5 is a perspective view of a breather outlet which is a part of the breather configuration for an electrical apparatus as shown in FIG. 2.

Referring to FIGS. 2, 3, and 4, a motor gear 12 of a wiper motor is accommodated in a motor gear case 11 which is formed by an aluminum die cast process. The motor gear case 11 is attached to a body panel 13. An installation hole 14 is provided at the part of the case 11 which faces the body panel 13. A breather outlet 15 is installed in the installation hole 14 by snap fitting so as to communicate the interior of the case 11 to atomosphere. As shown in FIG. 5, the breather outlet 15 includes a short shaft 17 having an air passage hole 16 at its center and a flange 19, which is installed at the end of the shaft 17, having a plurality of notches 18 for passing air at its periphery. A breather cap 20, which is cup shaped, is attached to the periphery of the flange 19 of the breather outlet 15. In detail, the breather cap 20 comprises a disc shaped member 20a and a flange 20a being integral with the disc shaped member 20a so as to contact the periphery of the flange 19 of the breather outlet 15. The disc shaped member 20a is disposed above the opening at the side of the flange 19 of the shaft 17. The case 11 has a wall 22 which is directed toward the body panel 13 to surround the breather outlet 15 with the breather cap 20 and the end of the wall 22 being spaced from the body panel 13 to form a small gap 21. Thus, the wall 22, the breather outlet 15, and the breather cap 20 are cooperatively arranged to form an air flow labyrinth 23. The wall 22 has an extended branch part 22a for reinforcing a body installing leg 24. The case 11 is integral with a motor yoke case 31 of the motor yoke section formed by a metal plate.

With the breather configuration described above, when the motor is activated and heated and the air inside the case 11 is expanded, the air in the case 11 is discharged to the outside of the case 11 through the labyrinth 23 and the gap 21. On the other hand, when the case 11 is wetted, as described above and the air inside the case 11 is cooled and contracted, air flows into the case 11 through the gap 21 and the labyrinth 23 as shown by an arrow A. And, when the case 11 is wetted such that the respiration of the breather configuration is carried out, most of the water falling on the breather outlet 15 may be discharged by the wall 22. And even if a small amount of water enters from the gap 21 as shown by an dotted arrow W, the labyrinth 23 effectively prevents the water W from being directed into the case 11.

In summary, it will be seen that the present invention provides a breather configuration which is incorporated into the case for an electrical apparatus so as to permit the omitting of an conventional breather tube. Thus, the troublesome work for installation of the breather tube is eliminated resulting in maintaining a low price and high reliability of the electrical component.

What is claimed is:

1. In a wiper motor for a vehicle, said wiper motor being accommodated in a case, a breather configuration comprising:

an installation hole formed in said case for bommunicating the interior of the case to atmosphere;

a breather outlet comprising a shaft having an air passage hole at the center thereof said shaft projecting outwardly from said installation hole and including a flange spaced from said installation hole, said flange having at least one air passage notch at a periphery thereof; and a breather cap having a side wall attached to the periphery of the flange of said breather outlet, said side wall extending past said flange and leaving said notch open to permit air to flow through said notch between said flange and said side wall, said cap also including an end wall connected to said side wall and spaced from an extreme end of said shaft, said cap and said flange being oriented to provide an air flow labyrinth, thereby preventing water from being directed into the case and providing a ventilation path for said case.

2. A breather configuration as claimed in claim 1, in which said end wall comprises a disc shaped member and said side wall comprises a flange which is in contact with a periphery of the flange of said breather outlet so that the disc shaped member is held at a position spaced from an opening of said air passage hole at said extreme end of the shaft of said breather outlet.

3. A breather configuration as claimed in claim 1, in which the wiper motor is attached to a support panel, said installation hole being provided at a part of the case which faces the support panel.

4. A breather configuration as claimed in claim 3, further comprising a wall which extends from the case toward the support panel so as to surround said breather outlet and breather cap and an end of which is spaced from the body panel to form a small gap.

5. A breather configuration as claimed in claim 4, in which said wall which extends from the case toward the support panel is integral with an extended branch part for reinforcing a leg for installation of the wiper motor.

* * * * *